(12) United States Patent
Tarazi et al.

(10) Patent No.: US 12,126,317 B1
(45) Date of Patent: Oct. 22, 2024

(54) FOLDED-PATCH IMPEDANCE TRANSFORMER

(71) Applicant: Altum RF IP B.V., Eindhoven (NL)

(72) Inventors: Jabra Tarazi, Marayong (AU); Anthony Peter Fattorini, Petersham (AU); Niels Kramer, 's-Hertogenbosch (NL)

(73) Assignee: ALTUM RF IP B.V., De Zaale (NL)

( * ) Notice: Subject to any disclaimer, the term of this patent is extended or adjusted under 35 U.S.C. 154(b) by 1021 days.

(21) Appl. No.: 16/940,980

(22) Filed: Jul. 28, 2020

Related U.S. Application Data

(60) Provisional application No. 62/968,376, filed on Jan. 31, 2020.

(51) Int. Cl.
| | |
|---|---|
| *H01F 27/28* | (2006.01) |
| *H01F 38/00* | (2006.01) |
| *H03F 1/56* | (2006.01) |
| *H03H 3/00* | (2006.01) |
| *H03H 7/38* | (2006.01) |

(52) U.S. Cl.
CPC .......... *H03H 7/38* (2013.01); *H01F 27/2804* (2013.01); *H01F 38/00* (2013.01); *H03F 1/565* (2013.01); *H03H 3/00* (2013.01)

(58) Field of Classification Search
CPC ........ H03H 7/38; H03H 3/00; H01F 27/2804; H01F 38/00; H03F 1/565
See application file for complete search history.

(56) References Cited

U.S. PATENT DOCUMENTS

| | | | |
|---|---|---|---|
| 10,536,128 B1 * | 1/2020 | Podell | ........................ H01P 3/06 |
| 2012/0206206 A1 * | 8/2012 | Winslow | ................. H03F 3/195 |
| | | | 330/307 |

* cited by examiner

*Primary Examiner* — Tuyen T Nguyen
(74) *Attorney, Agent, or Firm* — Maiorana Patent Law, PA

(57) ABSTRACT

An apparatus includes a first patch transformer segment, a second patch transformer segment, and a third patch transformer segment. The first, the second and the third patch transformer segments are generally coupled in series in a folded path between a first port and a second port.

20 Claims, 17 Drawing Sheets

FOLDED-PATCH IMPEDANCE TRANSFORMER

This application relates to U.S. Provisional Application No. 62/968,376, filed Jan. 31, 2020, which is hereby incorporated by reference in its entirety.

FIELD OF THE INVENTION

The invention relates to impedance matching circuits generally and, more particularly, to a method and/or apparatus for implementing a folded-patch impedance transformer.

BACKGROUND

According to the maximum power transfer theorem, a power source with internal resistance $R_P$ delivers maximum power into a load resistance $R_L$ when $R_L=R_P$. The load resistance $R_L$ is typically fixed by convention (e.g., 50 or 75 ohms).

A maximum AC voltage swing at transistor terminals of a transistor-based amplifying device is limited by a breakdown voltage of the transistor. High frequency circuits, such as microwave or millimeter-wave amplifiers, use transistors with small feature sizes that result in a lower breakdown voltage, hence lower operating voltage, hence lower maximum output power capability.

To scale up the output power capability, more transistors are needed in parallel (or bigger transistors) which results in lower $R_P$. In order to exceed the maximum power limitation, impedance transformation is required so that a lower load resistance $R_L$ is presented to the transistor-based amplifying device. Impedance transformers have fundamental bandwidth limitations (e.g. Bode-Fano criterion). For integrated circuit fabrication, an impedance transformer design needs to be planar.

It would be desirable to implement a folded-patch impedance transformer with wide bandwidth and low loss.

SUMMARY

The invention concerns an apparatus comprising a first patch transformer segment, a second patch transformer segment, and a third patch transformer segment. The first, the second and the third patch transformer segments are generally coupled in series in a folded path between a first port and a second port.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a folded-patch impedance transformer that may (i) provide an arbitrary impedance transformation ratio, (ii) provide wide bandwidth, (iii) provide low insertion loss, (iv) have small size, (v) be planar, (vi) provide high uniformity, (vii) have low sensitivity to manufacturing variations, (viii) provide high power handling, and/or (ix) be implemented in monolithic microwave integrated circuits (MMICs).

In various embodiments, a folded-patch impedance transformer with wide bandwidth and low loss may be implemented. In an example, a folded-patch impedance transformer in accordance with an embodiment of the invention may provide a wide bandwidth (e.g., exceeding an octave or 67% fractional bandwidth, where the bandwidth is defined by input and output return loss exceeding 10 dB). In an example, a folded-patch impedance transformer in accordance with an embodiment of the invention may have an insertion loss lower than 2 dB. In various embodiments, a folded-patch impedance transformer as described herein may be implemented using an insulating or semiconducting substrate material including, but not limited to, a semiconductor substrate of an integrated circuit, a printed circuit board, thin film or thick film hybrid technology, other insulating or semiconducting substrate technology having planar conductors deposited, sputtered, etched, plated to respective surfaces, and/or patterned by photo-lithography or other techniques, etc. In various embodiments, a folded-patch impedance transformer as described herein may be implemented on all types of semiconductor substrates (especially silicon, silicon carbide, gallium arsenide, gallium nitride, and indium phosphide) as well as other substrate materials such as glass, sapphire, alumina or other ceramics, polymers and other composite or laminated materials.

Figure 1:
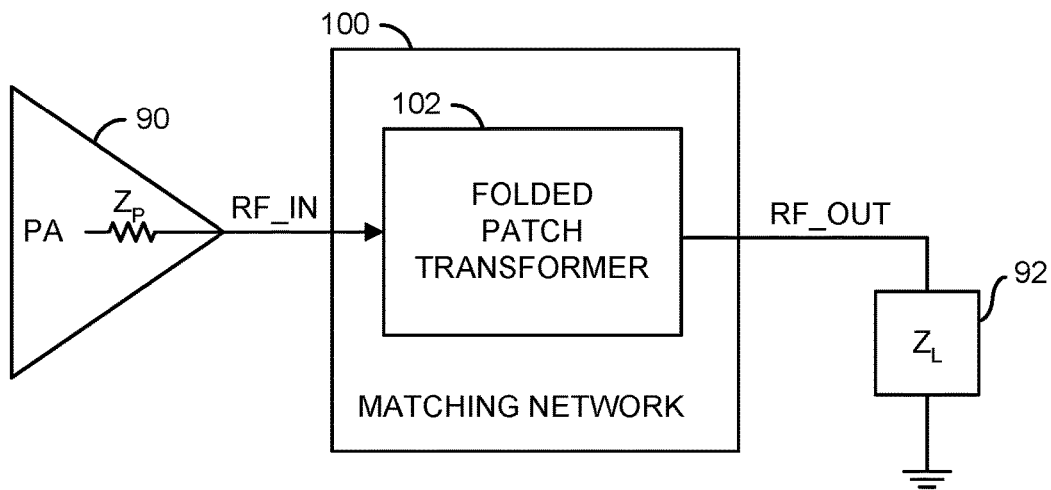
FIG. 1 is a diagram illustrating a context of the invention.

Referring to FIG. 1, a diagram is shown illustrating a context of the invention. In an example, an output of a radio frequency (RF) amplifier 90 may present a radio frequency (RF) signal (e.g., RF_IN) to an input port of a matching network 100. An RF signal (e.g., RF_OUT) may be presented at an output port of the matching network 100. In various embodiments, the matching network 100 may operate to match an output impedance (e.g., $Z_P$) of the amplifier 90 to a load impedance (e.g., $Z_L$) of a device or transmission medium 92 connected to the output port of the matching network 100. In an example, the matching network 100 may comprise a folded-patch impedance transformer 102 implemented in accordance with embodiments of the invention. The folded-patch impedance transformer 102 generally provides an impedance transformation (H) that allows the amplifier 90 to see the conjugate match of the load impedance $Z_L$ as being substantially equal to the output impedance $Z_P$ of the amplifier 90 (e.g., $Z_P = H*Z_L$) to facilitate maximum power transfer.

In an example, the amplifier 90 may be implemented as a gallium nitride (GaN) power amplifier (PA) on a silicon carbide (SiC) substrate. For 0.15 micron GaN-on-SiC, a typical operating voltage of the amplifier 90 may be about 20 Volts (V). An output resistance $R_P$ for delivering maximum power is typically about 35 Ohm·millimeters (Ω·mm) with a power density of 3 Watts (W)/mm. The output resistance $R_P$, generally defined as the internal source resistance, may be calculated as follows:

$$R_P = \frac{\text{Operating Voltage } (V) - \text{Knee Voltage } (V)}{\text{DC Current } (A)} \qquad \text{EQ. 1}$$

In the example where operating voltage is 20V, knee-voltage is 4V, and DC current is 0.45 A, the output resistance $R_P$ would equal ~(20−4)/0.45=35 Ohms·mm. The output resistance value $R_P$ is a characteristic of the device and cannot be changed. However, the load resistance $R_L$ may be changed to maximize the delivered power (e.g., setting $R_L = R_P$). In an example implementing a resistive load, a load resistance $R_L$ of approximately 20Ω is needed to achieve an output power of 10 W (in an ideal case). The load resistance $R_L$ may be further reduced by a transistor knee voltage.

Figure 2:
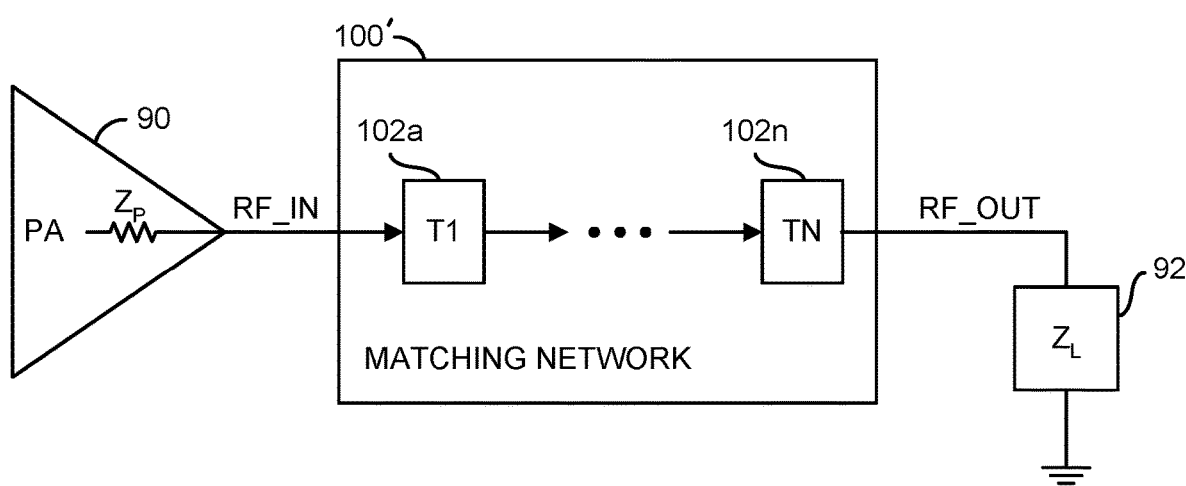
FIG. 2 is a diagram illustrating another context of the invention.

Referring to FIG. 2, a diagram is shown illustrating another context of the invention. In an example, the matching network 100 may be replaced by a matching network 100'. In various embodiments, the matching network 100' may comprise a plurality of patch transformers coupled in series to achieve higher transform ratios fo matching the output impedance $Z_P$ of the amplifier 90 to the load impedance $Z_L$ of the device or transmission medium 92 connected to the output port of the matching network 100'. In some embodiments, the matching network 100' may comprise a plurality of patch transformers combined to achieve higher output power levels.

Figure 3:
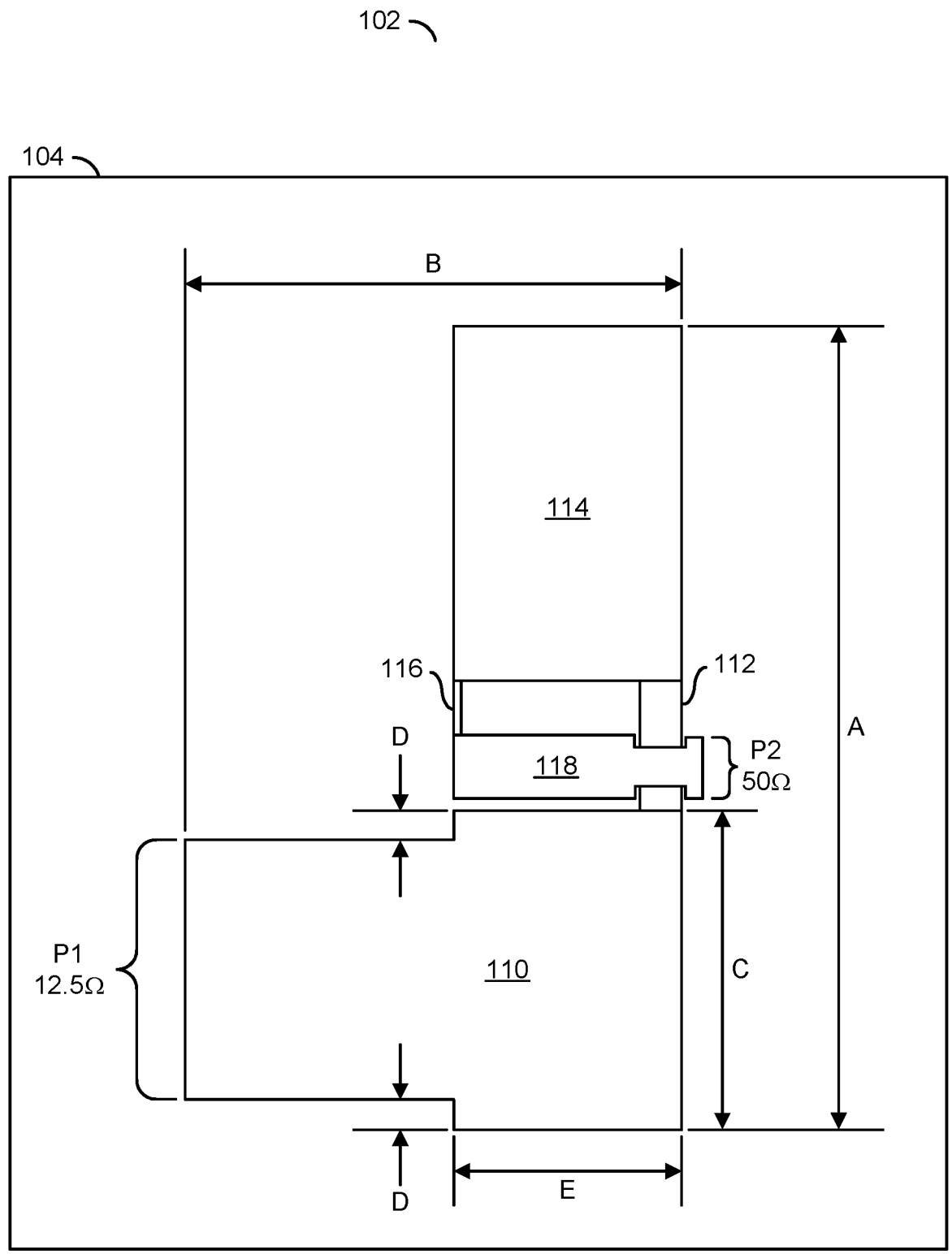
FIG. 3 is a diagram illustrating an example implementation of a folded-patch transformer in accordance with an example embodiment of the invention.

Referring to FIG. 3, a diagram is shown illustrating an example implementation of the folded-patch transformer 102 of FIG. 1 in accordance with an example embodiment of the invention. In an example, the folded-patch transformer 102 may be designed and fabricated for operation in a frequency range of 5 to 43.5 giga-Hertz (GHz). In an example, the folded-patch transformer 102 may be fabricated on a substrate 104. In various embodiments, the substrate 104 may be implemented using an insulating or semiconducting substrate material including, but not limited to, an integrated circuit, a printed circuit board, thin film or thick film hybrid technology, other insulating or semiconducting substrate technology. In an example, application of the folded-patch transformer as described herein may be implemented on all types of semiconductor substrates (especially silicon, silicon carbide, gallium arsenide, gallium nitride, and indium phosphide) as well as other substrate materials such as glass, sapphire, alumina or other ceramics, polymers and other composite or laminated materials.

In an example, the folded-patch transformer 102 may comprise a first patch transformer segment 110, a second patch transformer segment 112, a third patch transformer segment 114, a fourth patch transformer segment 116, and a fifth patch transformer segment 118. The patch transformer segments 110, 112, 114, 116, and 118 may be coupled in series in a folded path between a first port P1 and a second port P2. In an example, the patch transformer segment 118 may be edge-coupled to the patch transformer segment 110. In an example, the patch transformer segments 112 and 116 may be implemented using at least one of a transmission line, a stripline transmission line, a microstrip transmission line, an interconnect, and an electro-magnetic coupling structure. In an example, the folded-patch transformer 102 may be configured to provide a 4:1 impedance transformer. In an example, an impedance of 50Ω connected at the port P2 may appear to be an impedance of 12.5Ω to a device coupled to the port P1. However, other arbitrary impedance transformation ratios may be implemented accordingly. In an example, an electromagnetic simulation tool (e.g., Keysight Momentum®, etc.) may be used to model variations of the folded-patch transformer 102.

In an example, the folded-patch transformer 102 may have an overall height A and an overall width B. In an example, a length of the patch transformer segment 110 may be B. In some embodiments, the patch transformer segment 110 may have a first portion and a second portion. The second portion may be wider than the first portion. In an example, the second portion of the segment 110 may have a width (or height) C. The first portion of the segment 110 may have a width (or height) that is reduced from the width (or height) of the second portion by an amount of D on both sides. The second portion of the segment 110 may have a length of E. The first portion of the segment 110 may have a length of B−E. In an example, the dimensions of the folded-patch transformer 102 may be summarized in the following TABLE 1:

TABLE 1

| | |
|---|---|
| A | 1 mm |
| B | 0.75 mm |
| C | ~0.42 mm |
| D | 63 um |
| E | ~0.33 mm |

In various embodiments, an electromagnetic simulation tool (e.g., Keysight Momentum®) may be used to model the folded-patch impedance transformer designs to determine particular dimensions.

In various embodiments, substrate 104 may have a continuous conducting ground plane (not visible). The ground plane is generally on an underside of the substrate 104. In an example, the substrate may be approximately 50 to 100 microns thick. The ground plane itself generally has a total thickness similar to the metal features of the folded-patch transformer 102. In an example, the ground plane may have a thickness of approximately 3 to 5 microns. In an example, the ground plane may comprise gold. However, other metallic materials (e.g., copper, aluminum, etc.) may be used to meet design criteria of a particular implementation. In embodiments implemented using stripline technology, a second continuous conducting ground plane (not shown) may be implemented above the folded-patch transformer 102.

Figure 4:
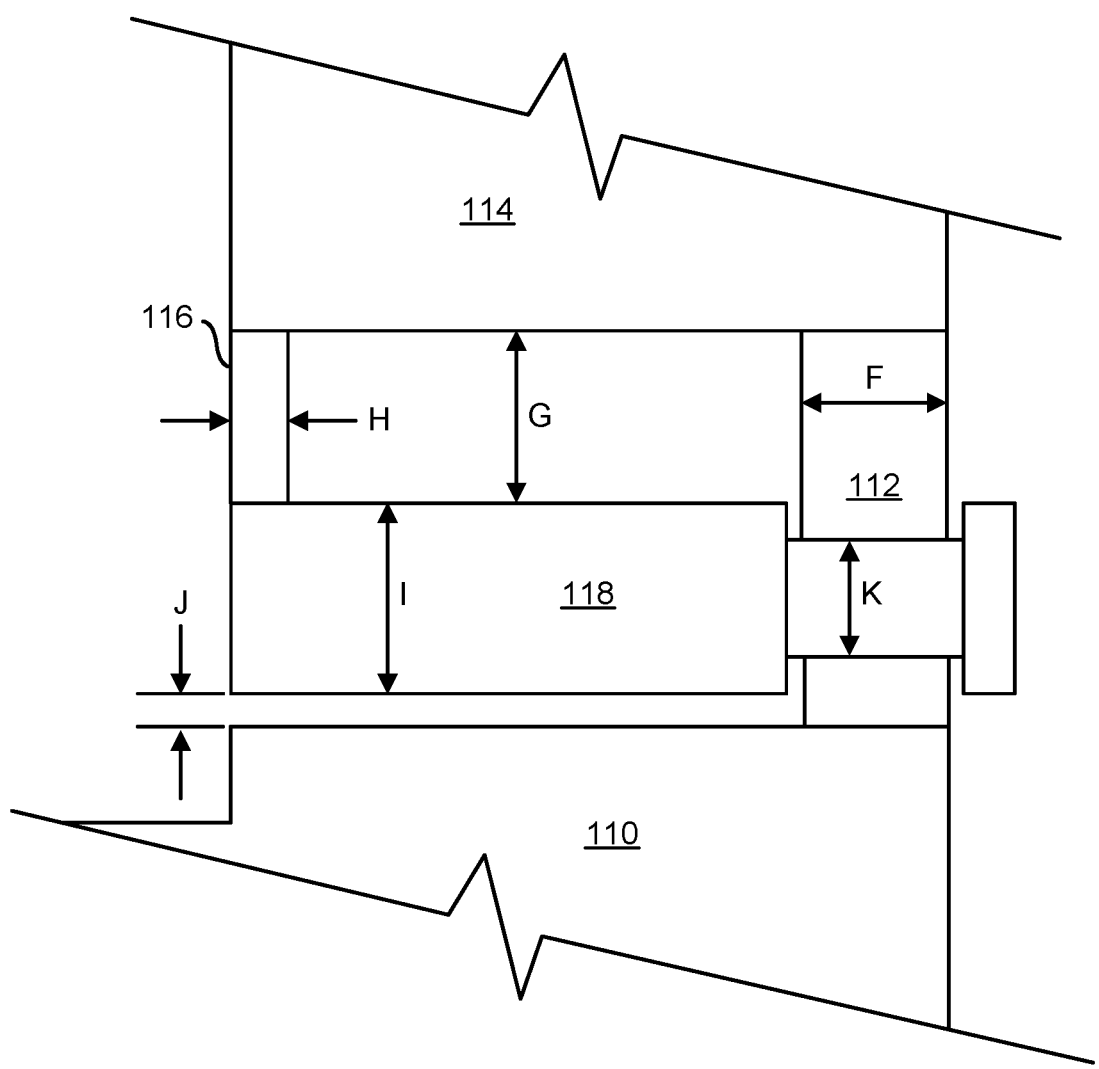
FIG. 4 is a diagram illustrating a cross-over portion of the folded-patch transformer of FIG. 3.

Referring to FIG. 4, a diagram is shown illustrating an enlarged view of a cross-over portion of the folded-patch transformer 102 of FIG. 3. In an example, the patch transformer segment 112 connects a corner of the patch transformer segment 110 to a first corner of the patch transformer segment 114. The patch transformer segment 116 connects a second corner of the patch transformer segment 114 to a first end of the patch transformer segment 118. A second end of the patch transformer segment 118 passes over the patch transformer segment 112 to connect to the port P2. In an example, the patch transformer segment 112 has a width of F. In an example, the patch transformer segment 116 has a length of G and a width of H. In an example, the patch transformer segment 118 has a length of E, a first width of I at the first end, and a second width of K at the second end. In an example, the patch transformer segment 118 and the patch transformer segment 110 may be edge-coupled. However, technology supporting broadside coupling may also be used. In an example, the patch transformer segment 118 may be separated from the patch transformer segment 110 by a gap J. In an example, examples of the dimensions of the folded-patch transformer 102 may be summarized in the following TABLE 2:

TABLE 2

| | |
|---|---|
| F | 67 um |
| G | 77 um |
| H | 15 um |
| I | 95 um |
| J | 5 um |
| K | 67 um |

Figure 5:
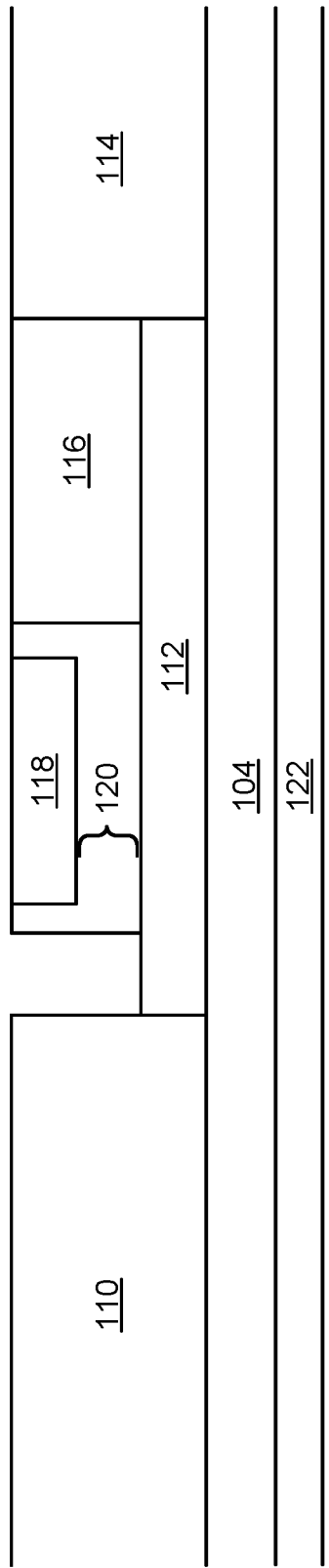
FIG. 5 is a cross-sectional view illustrating an airgap in the cross-over portion of the folded-patch transformer of FIG. 3.

Referring to FIG. 5, a cross-sectional view is shown illustrating an air-bridge feature in the cross-over portion of the folded-patch transformer 102 of FIG. 3. In an example, the folded-patch transformer 102 may be fabricated on the substrate 104 comprising three layers. In various embodiments, the three layers of the folded-patch transformer 102 generally comprise a metallic material (e.g., copper, gold, etc.). The patch transformer segments 110, 114, and 116 may be three layers thick. The patch transformer segment 112 may occupy a single, lowest layer. The first end of the patch transformer segment 118 may be three layer thick and the second end of the patch transformer segment 118 may occupy a single, highest layer, in order to pass over the patch transformer segment 112. In various embodiments, a single layer gap 120 generally separates the patch transformer segment 112 and the second end of the patch transformer segment 118.

In an example, the gap 120 may be implemented as an air-bridge. In another example, the gap 120 may comprise an insulating material. In an example, an air-bridge may be used to increase/optimize the coupling and reduce the total size of the folded-patch transformer 102. In some embodiments, the air-bridge may be replaced with hot via, wire-bond, ribbon, or similar interconnect technology. In various embodiments, wide patches forming the folded-patch transformer 102 may be synthesized using thinner lines/patches and capacitors to ground (e.g., a lumped-distributed equivalent network) or open stubs which may result in a more compact transformer. In various embodiments, the folded-patch transformer 102 has DC pass-through. In some embodiments, the folded-patch transformer 102 may be used as part of a bias feed. In some embodiments, a 50Ω input line may be AC coupled to the output of the folded-patch transformer 102.

The substrate 104, on which the folded-patch transformer 102 is fabricated, generally has a continuous conducting ground plane 122. The ground plane 122 is generally on an opposite side (e.g., underside) of the substrate 104 from the folded-patch transformer 102. In an example, the substrate 104 may be 50 to 100 microns thick. The ground plane 122 generally has a total thickness similar to the metal features of the folded-patch transformer 102. In an example, the ground plane 122 may have a thickness of approximately 3 to 5 microns. In an example, the ground plane 122 may comprise gold. However, other metallic materials may be used to meet design criteria of a particular implementation.

Figure 6:
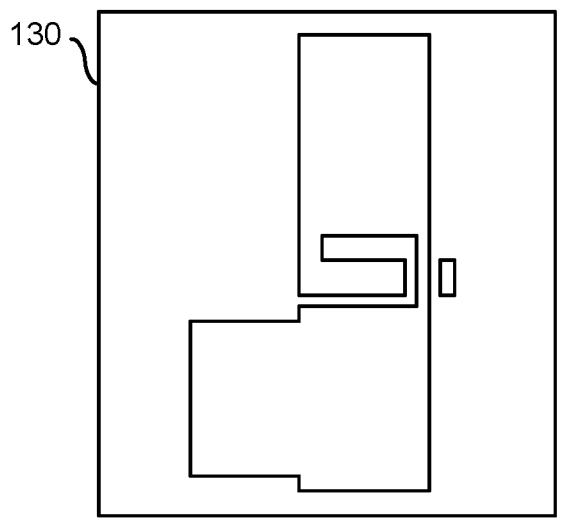
FIG. 6 is a diagram illustrating metal layers of the folded-patch transformer of FIG. 3.
Figure 6:
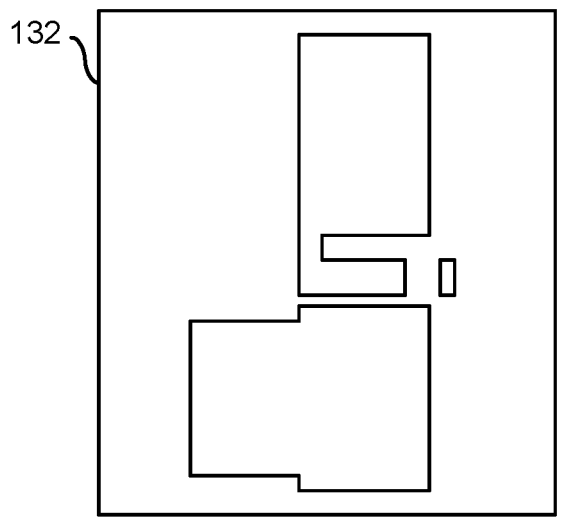
Figure 6:
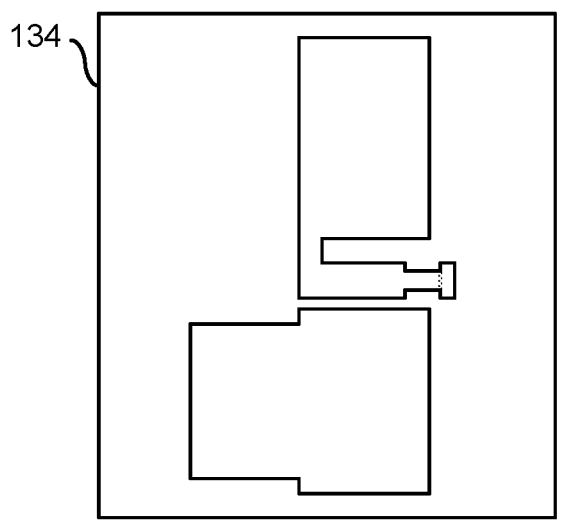

Referring to FIG. 6, diagrams are shown illustrating the metal layers forming the folded-patch transformer 102 of FIG. 3. In various embodiments, the layers may be implemented using planar conductors deposited, sputtered, etched, plated to respective surfaces, patterned by photolithography or other techniques, etc. In an example, a first, lowest layer is illustrated in diagram 130, a second, middle layer is illustrated in diagram 132, and a third, highest layer illustrated in diagram 134.

Figure 7:
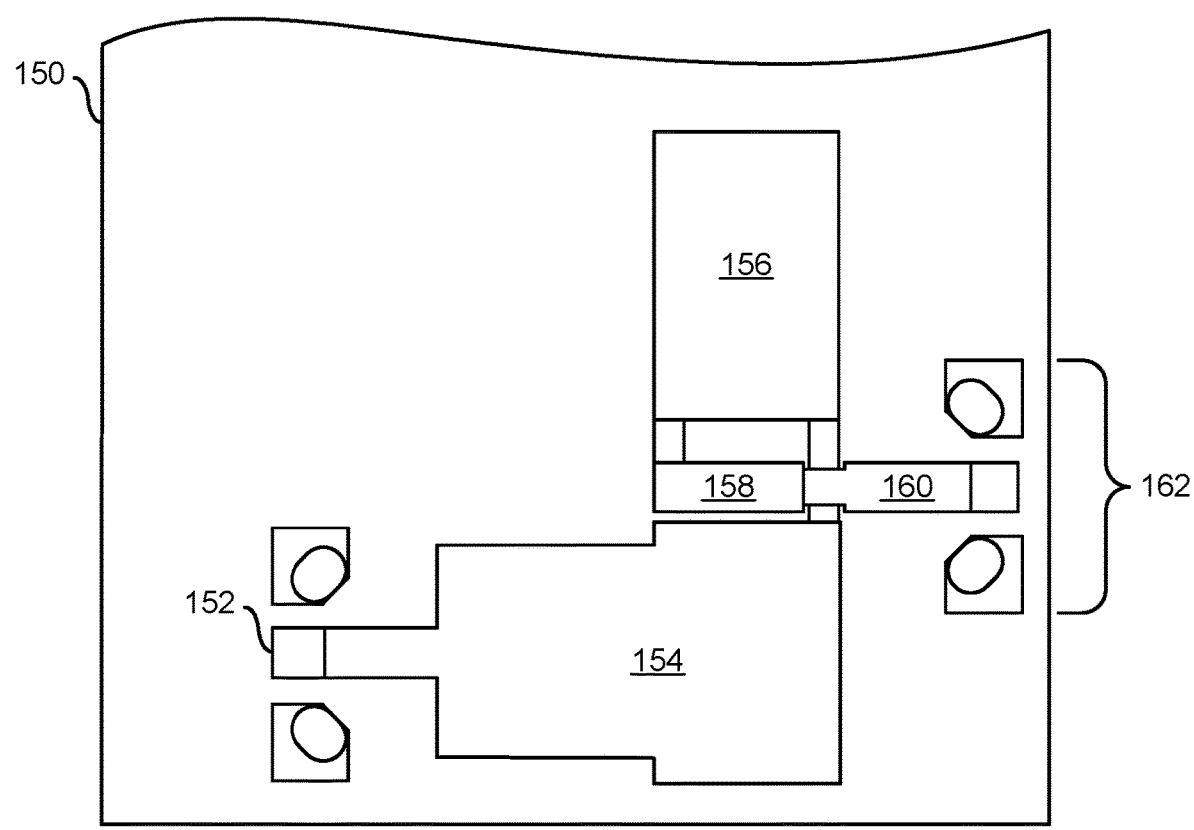
FIG. 7 is a diagram illustrating a monolithic microwave integrated circuit implementation of the folded-patch transformer of FIG. 3.

Referring to FIG. 7, a diagram is shown illustrating an implementation of the folded-patch transformer 102 of FIG. 3 on a monolithic microwave integrated circuit 150. The folded-patch transformer 102 is shown connected between a first input/output port 152 and a second input/output port 162.

Figure 8:
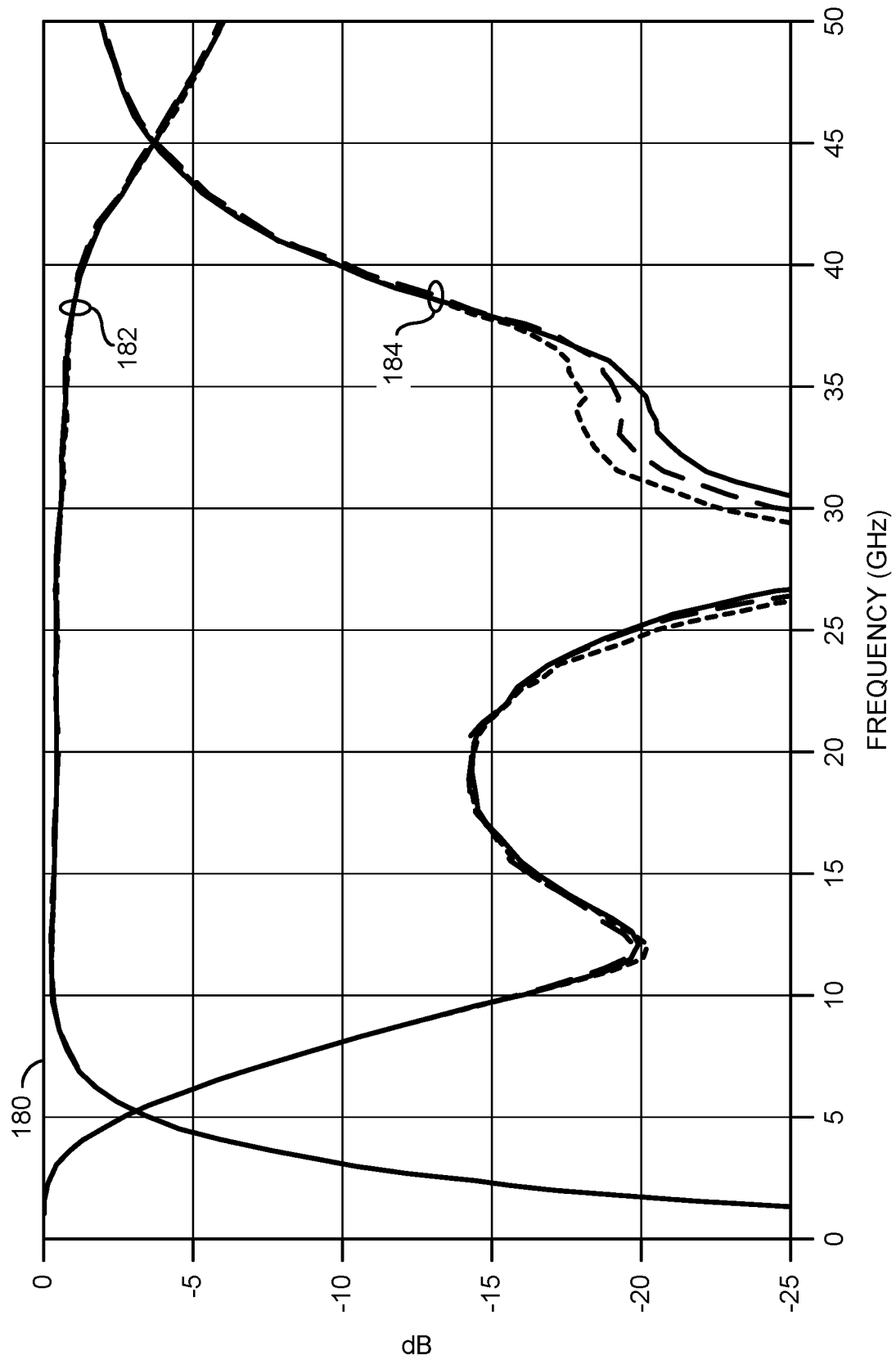
FIG. 8 is a diagram illustrating three measured samples and simulated insertion loss and return loss for an embodiment of the folded-patch transformer illustrated in FIGS. 3 and 7 with a 4:1 impedance transformation ratio.

Referring to FIG. 8, a diagram is shown illustrating measured insertion loss and return loss curves for three samples of the folded-patch transformer of FIG. 7. In an example, a graph 180 shows a group of curves 182 and a group of curves 184. The group of curves 182 generally illustrates insertion loss measurements for three samples of the folded-patch transformer implementation of FIG. 7. The group of curves 184 generally illustrates return loss measurements for the three samples of the folded-patch transformer implementation of FIG. 7. In general, a folded-patch impedance transformer in accordance with embodiments of the invention generally has low sensitivity to manufacturing variations, providing high uniformity and repeatability.

Figure 9:
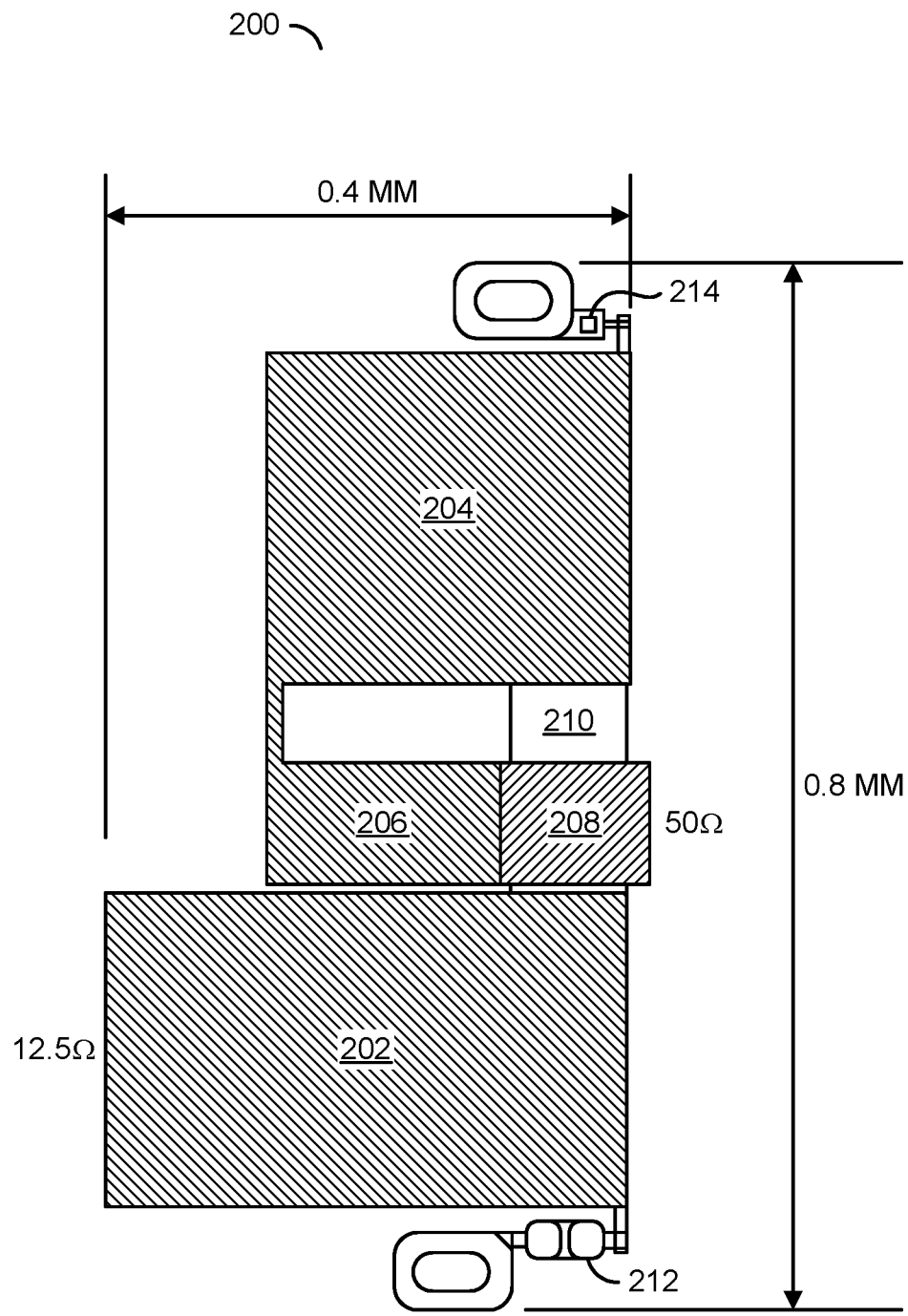
FIG. 9 is a diagram illustrating another example implementation of a folded-patch transformer in accordance with an example embodiment of the invention.

Referring to FIG. 9, a diagram is shown illustrating another example implementation of a folded-patch transformer in accordance with an example embodiment of the invention. In an example, a more compact folded-patch transformer 200 may be designed and fabricated for operation in the frequency range of 5 to 43.5 giga-Hertz (GHz). In an example, the folded-patch transformer 200 may comprise a first patch transformer segment 202, a second patch transformer segment 204, a third patch transformer segment 206, a fourth patch transformer segment 208, a fifth patch transformer segment 210, a shunt capacitor 212, and a shunt capacitor 214. The shunt capacitors 212 and 214 generally provide corner loading, which reduces the patch dimensions. In one example, the shunt capacitors 212 and 214 may be implemented as parallel plate capacitors, such as metal-insulator-metal (MIM) capacitors, with, for example, a silicon nitride dielectric. In an other example, integrated metal fingers or open microstrip stubs may be used to implement the shunt capacitors 212 and 214.

The patch transformer segments 202, 204, 206, 208, and 210 are generally coupled in series in a folded path between a first port P1 and a second port P2. In an example, the folded-patch transformer 200 may be configured to provide a 4:1 impedance transformer. In an example, an impedance of 50Ω connected at the port P2 may appear to be an impedance of 12.5Ω to a device coupled to the port P1. In an example, the folded-patch transformer 200 may have an overall width of 0.8 mm and an overall length of 0.4 mm. In general, a width of the patch segments of the folded-patch impedance transformer 200 may be increased for larger impedance transformation ratios and a length of the patch segments of the folded-patch impedance transformer 200 may be shortened for higher frequency transformation. In various embodiments, an electromagnetic simulation tool (e.g., Keysight Momentum®) may be used to model the folded-patch impedance transformer designs.

Figure 10:
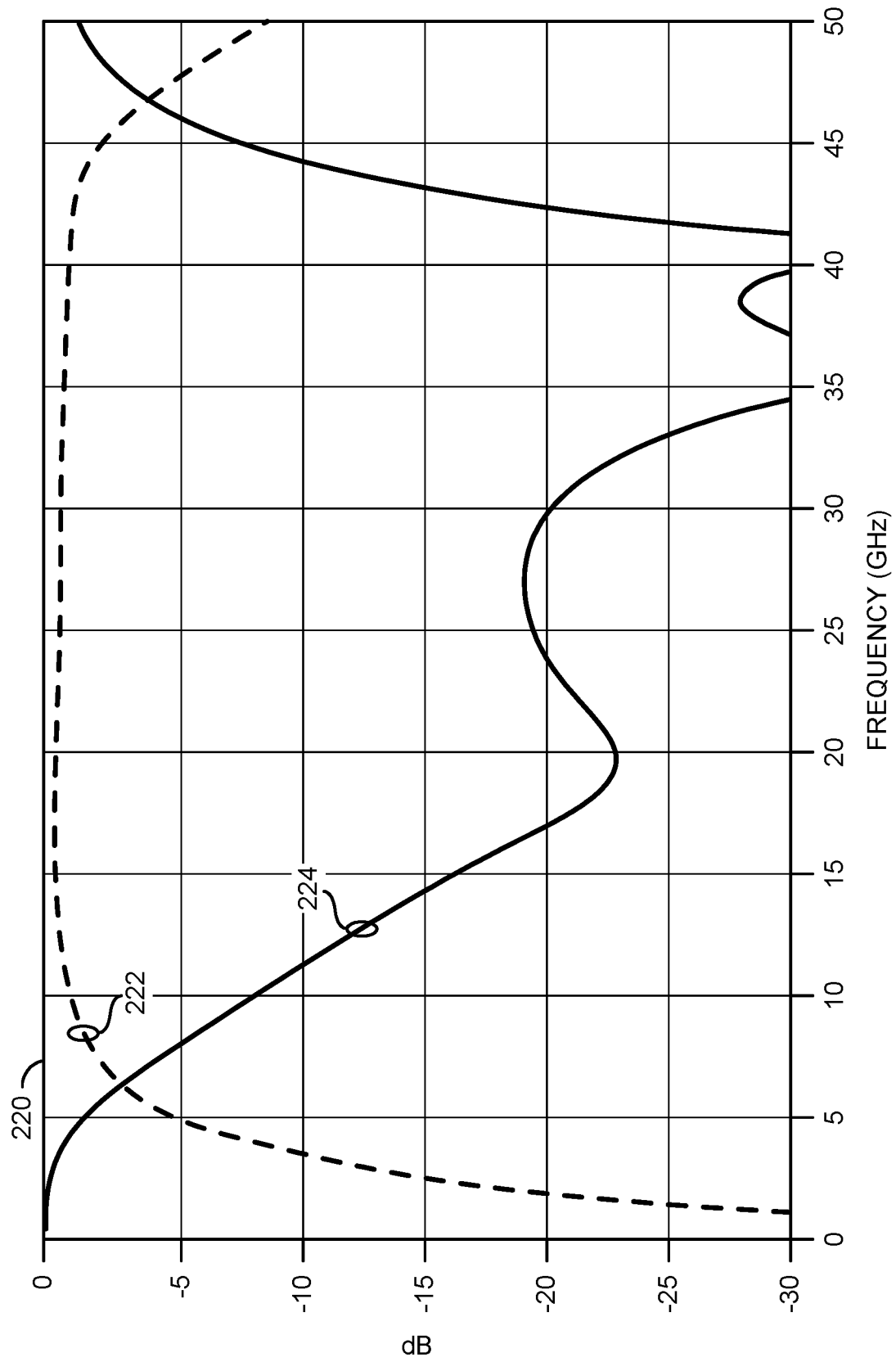
FIG. 10 is a diagram illustrating simulated insertion loss and return loss curves for the folded-patch transformer of FIG. 9.

Referring to FIG. 10, a diagram is shown illustrating simulated insertion loss and return loss curves for the folded-patch transformer of FIG. 9. In an example, a graph 220 shows a curve 222 and a curve 224. The curve 222 generally illustrates insertion loss of the folded-patch transformer implementation of FIG. 8. The curve 224 generally illustrates return loss of the folded-patch transformer implementation of FIG. 8.

Figure 11:
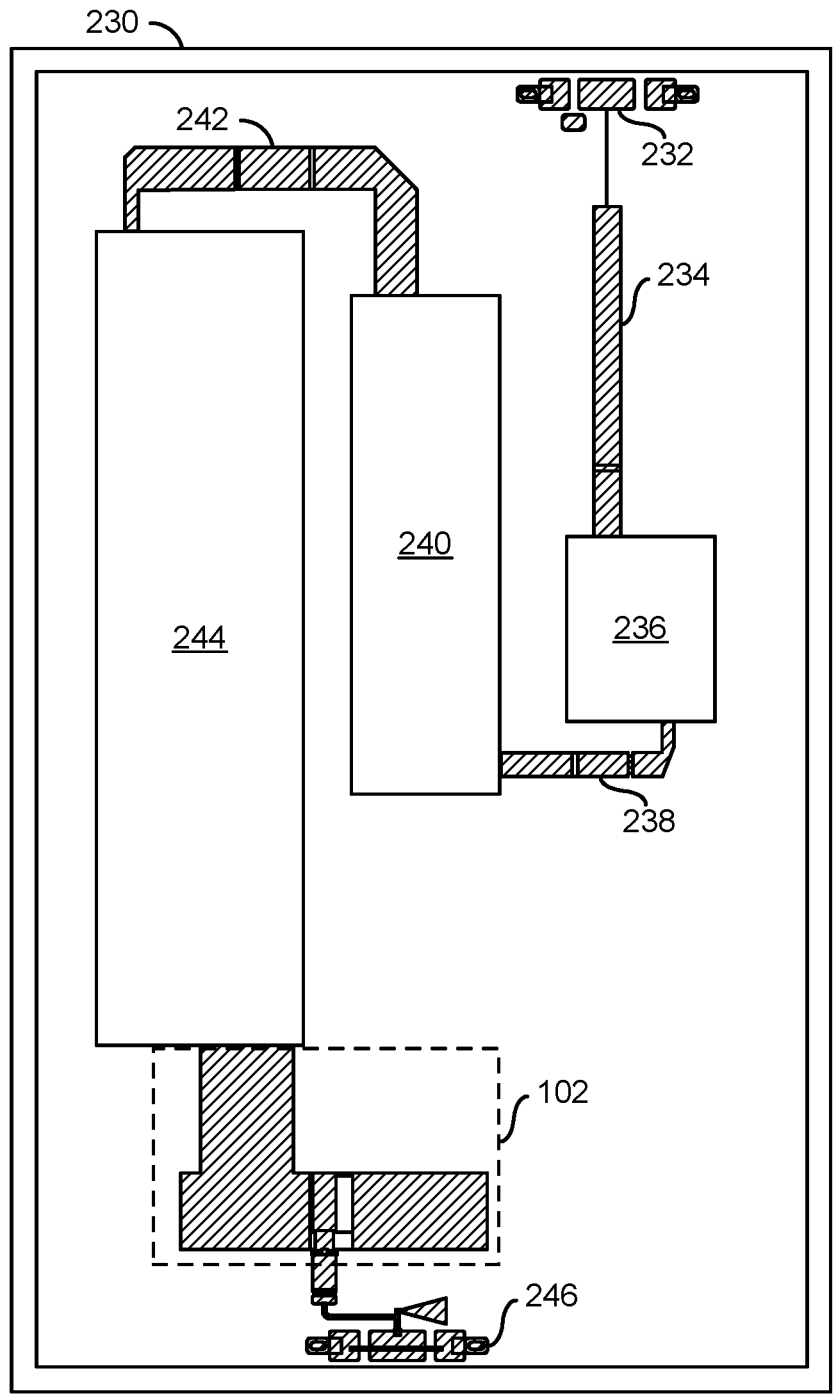
FIG. 11 is a diagram illustrating an example application of a folded-patch transformer in accordance with an example embodiment of the invention.

Referring to FIG. 11, a diagram is shown illustrating an example application of a folded-patch transformer in accordance with an example embodiment of the invention. In an example, an integrated circuit amplifier 230 may comprise an input port 232, a first transmission line 234, a first amplifier stage 236, a second transmission line 238, a second amplifier stage 240, a third transmission line 242, a third amplifier stage 244, and an output port 246. The first transmission line 234 may couple the input port 232 to an input of the first amplifier stage 236. The second transmission line 238 may couple an output of the first amplifier stage 236 to an input of the second amplifier stage 240. The third transmission line 242 may couple an output of the second amplifier stage 240 to an input of the third amplifier stage 244. An output of the third amplifier stage 244 may be coupled to the output port 246 using the folded-patch impedance transformer 102 of FIG. 3.

Figure 12:
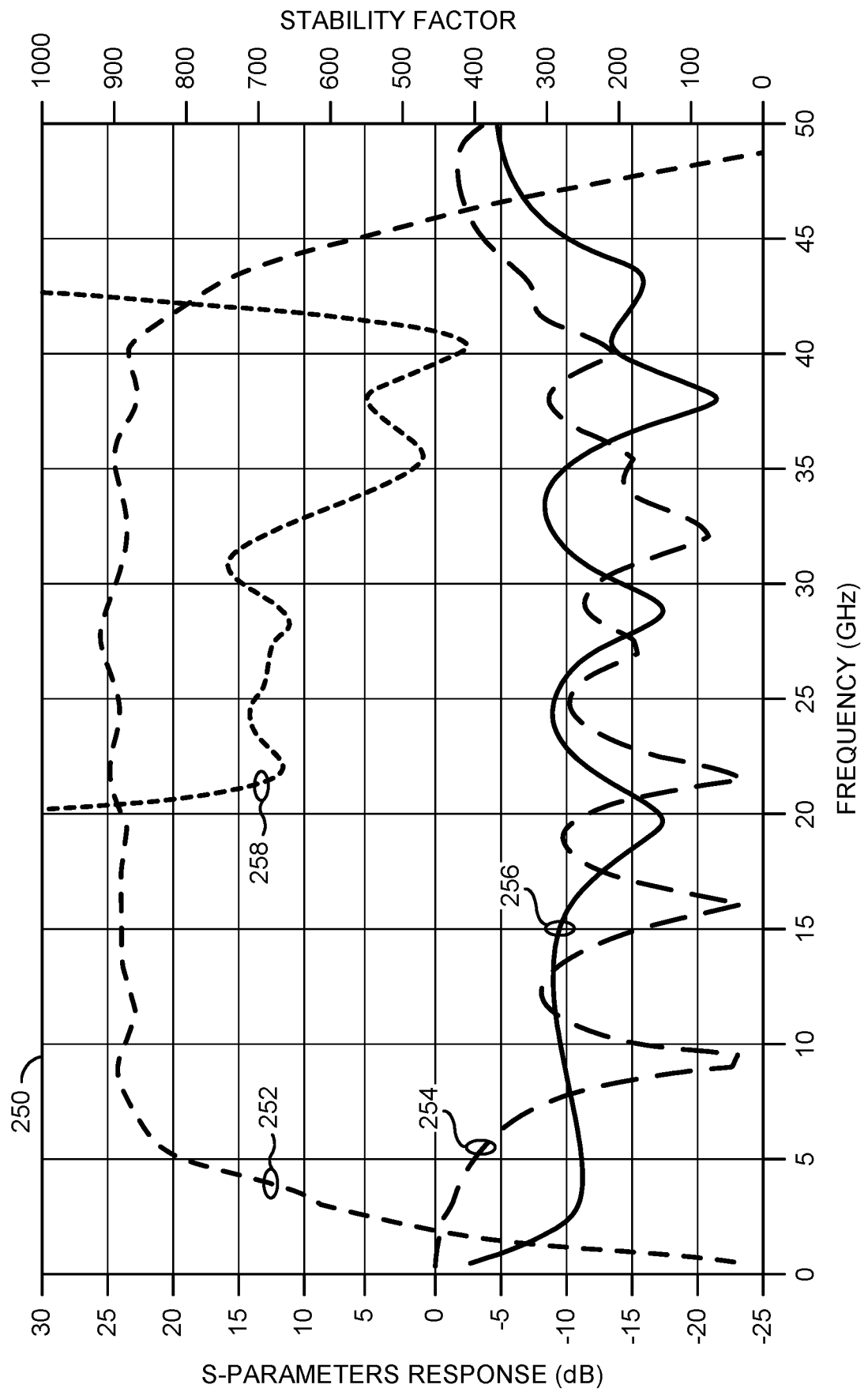
FIG. 12 is a diagram illustrating simulated S-parameter response and stability factor curves for a folded-patch transformer in accordance with an example embodiment of the invention.

Referring to FIG. 12, a diagram is shown illustrating simulated S-parameter and stability factor curves for an integrated circuit amplifier in accordance with an example embodiment of the invention. In an example, a graph 250 shows a curve 252, a curve 254, a curve 256, and a curve 258. The curve 252 generally illustrates a gain of the integrated circuit amplifier. The curve 254 generally illustrates output return loss of the integrated circuit amplifier. The curve 256 generally illustrates output return loss of the integrated circuit amplifier. The curve 258 generally illustrates stability factor.

Figure 13:
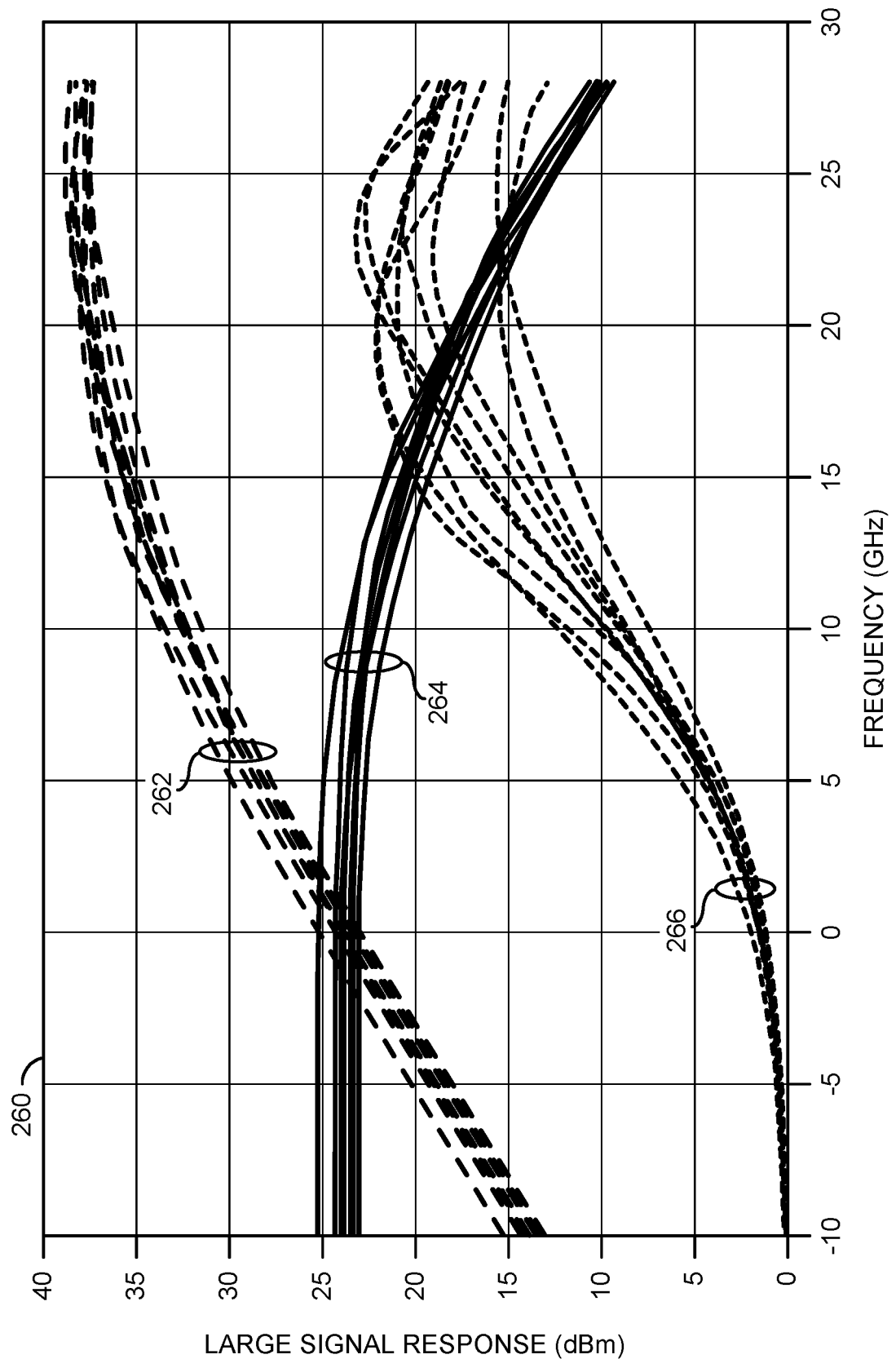
FIG. 13 is a diagram illustrating effective output power, gain, and power-added efficiency curves for folded-patch transformers in accordance with an example embodiment of the invention.

Referring to FIG. 13, a diagram is shown illustrating effective output power and gain curves for another integrated circuit amplifier in accordance with an example embodiment of the invention. In an example, a graph 260 shows a group of curves 262, a group of curves 264, and a group of curves 266. The group of curves 262 generally illustrates output power $P_{OUT}$. The group of curves 264 generally illustrates gain. The group of curves 266 generally illustrates a power added efficiency (PAE) parameter.

Figure 14:
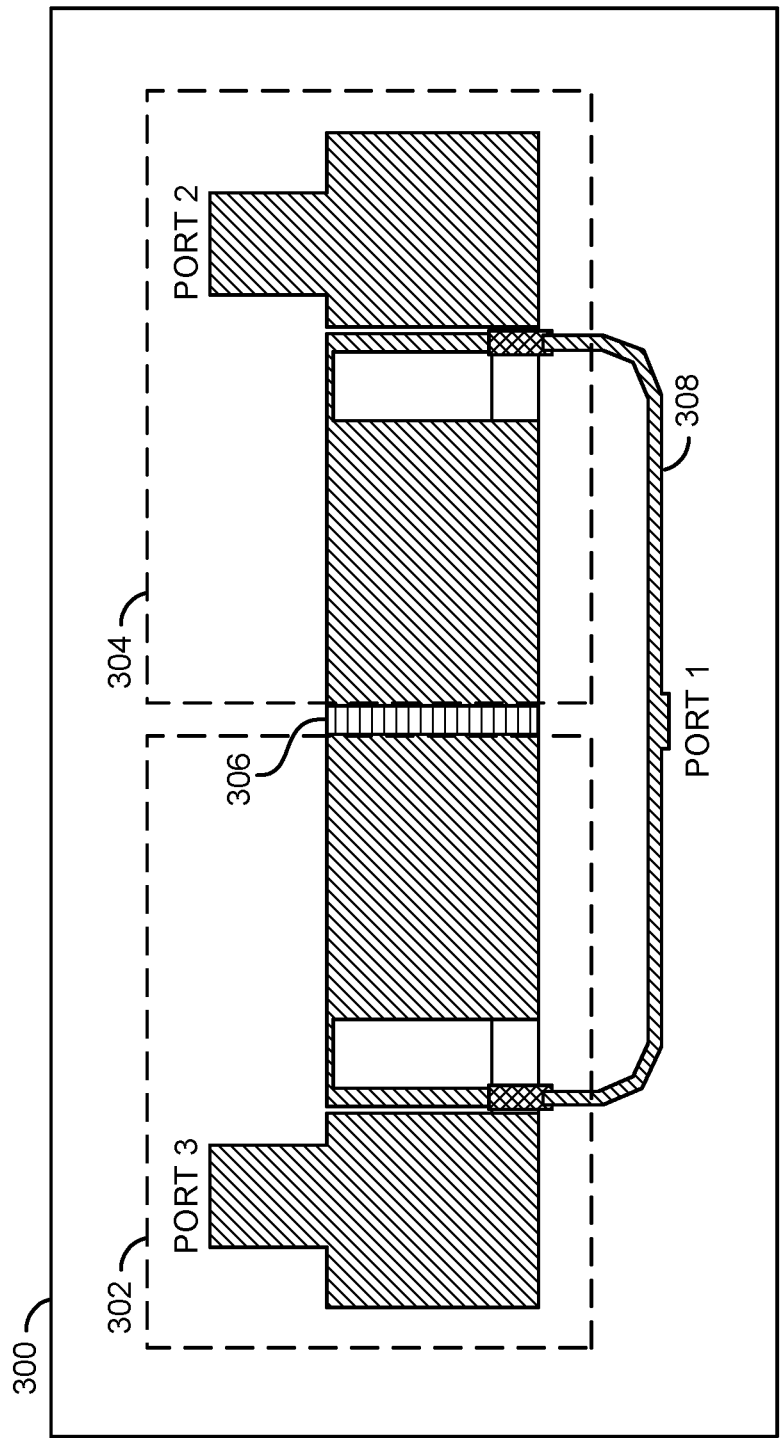
FIG. 14 is a diagram illustrating a power combiner implemented with two folded-patch transformers in accordance with an example embodiment of the invention.

Referring to FIG. 14, a diagram is shown illustrating a power combiner implemented with two folded-patch transformers in accordance with an example embodiment of the invention. In an example, for even more output power, two or more folded-patch transformers may be combined to form an in-phase wideband power combiner 300 with impedance transformation and isolation between ports. In an example, the wideband power combiner 300 may comprise a first folded-patch transformer 302 and a second folded-patch transformer 304. The folded-patch transformers 302 and 304 may be implemented using mirror copies of the folded-patch transformer 102 of FIG. 3. The folded-patch transformers 302 and 304 are generally couple together by an odd-mode suppression thin film resistor (TFR) 306 and a bridge 308. In an example, a wide TFR (or EPI) resistor may be used between the two folded-patch transformers 302 and 304 across their length to increase port-to-port isolation and/or suppress the odd mode (e.g., to improve stability of amplifiers).

Figure 15:
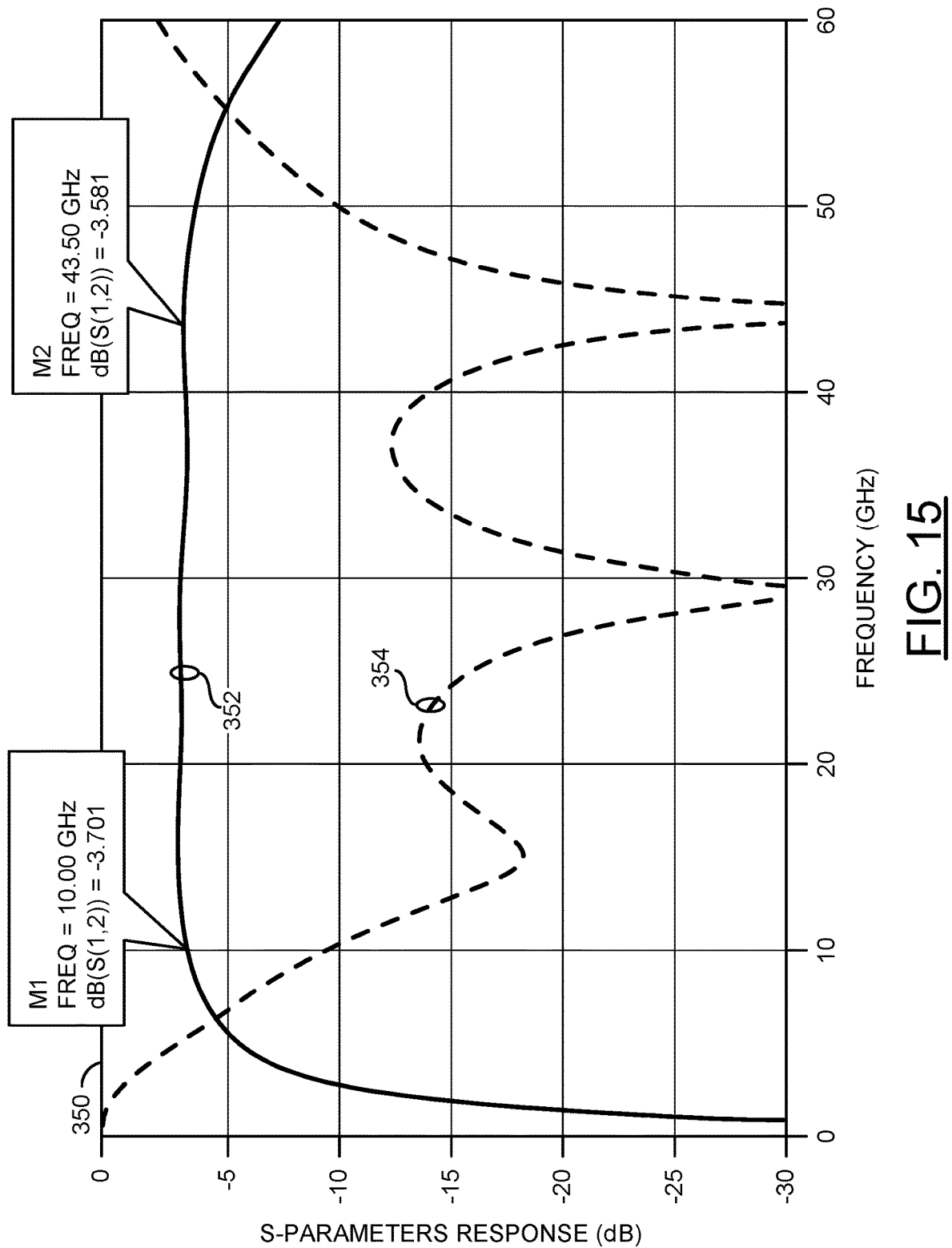
FIG. 15 is a diagram illustrating simulated insertion loss and return loss curves for the power combiner of FIG. 14.

Referring to FIG. 15, a diagram is shown illustrating simulated insertion loss and return loss curves for the power combiner 300 of FIG. 14. In an example, a graph 350 shows a curve 352 and a curve 354. The curve 352 generally illustrates the S-parameter S11 for the power combiner 300 of FIG. 14. The curve 354 generally illustrates the S-parameter S13 for the power combiner 300 of FIG. 14.

Figure 16:
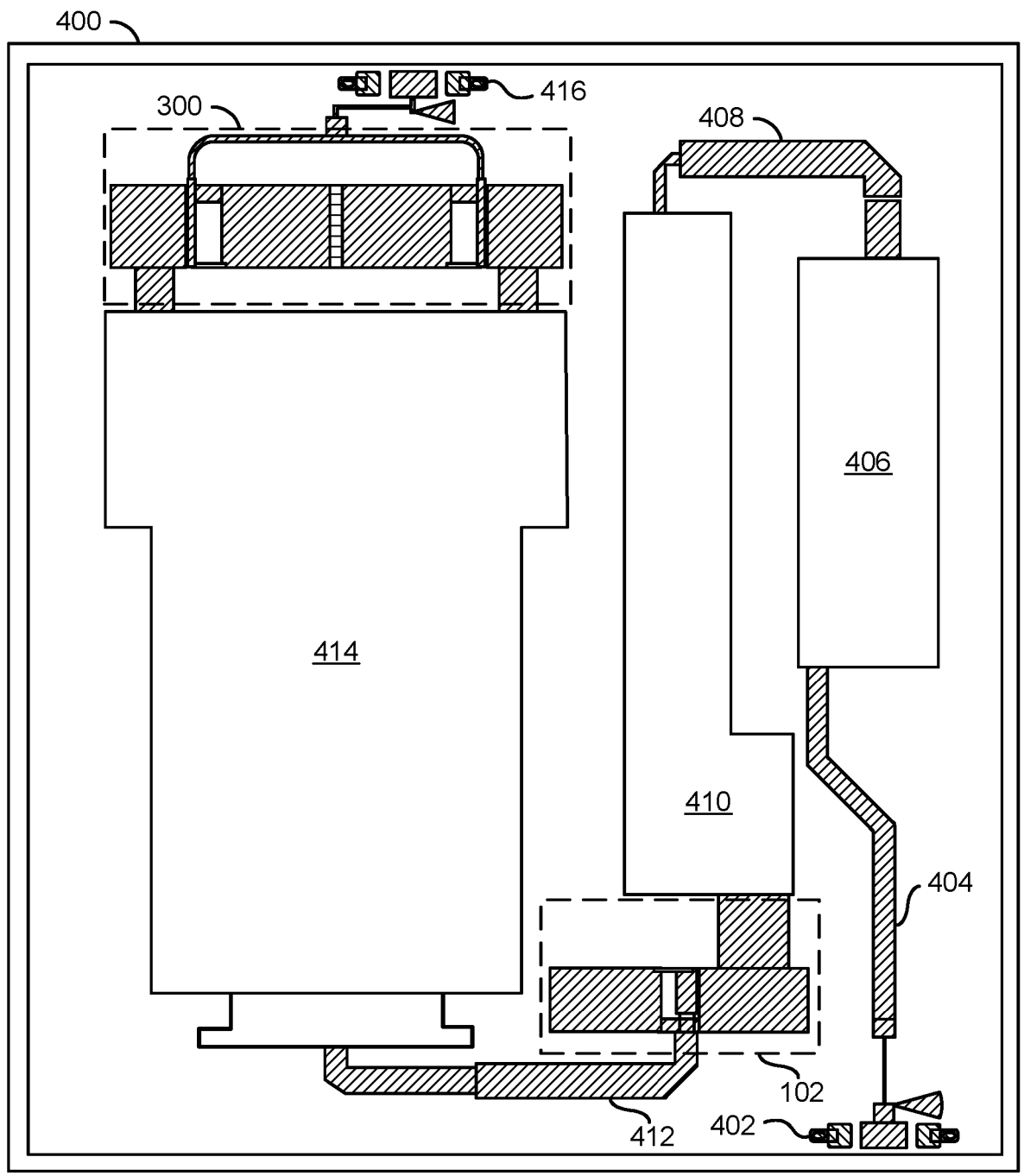
FIG. 16 is a diagram illustrating an example application utilizing a folded-patch transformer and a power combiner in accordance with example embodiments of the invention.

Referring to FIG. 16, a diagram is shown illustrating an example integrated circuit amplifier application utilizing a folded-patch transformer and a power combiner in accordance with an example embodiment of the invention. In an example, an integrated circuit amplifier 400 may comprise an input port 402, a first transmission line 404, a first amplifier stage 406, a second transmission line 408, a second amplifier stage 410, a third transmission line 412, a third amplifier stage 414, and an output port 416. The first transmission line 404 may couple the input port 402 to an input of the first amplifier stage 406. The second transmission line 408 may couple an output of the first amplifier stage 406 to an input of the second amplifier stage 410. An output of the second amplifier stage 410 may be coupled to the third transmission line 412 using an instance of the folded-patch impedance transformer 102 of FIG. 3. The third transmission line 412 may couple an output of the folded-patch impedance transformer 102 to a pair of inputs of the third amplifier stage 414. A pair of outputs of the third amplifier stage 414 may be coupled to the output port 416 using an instance of the wideband power combiner of FIG. 14.

Figure 17:
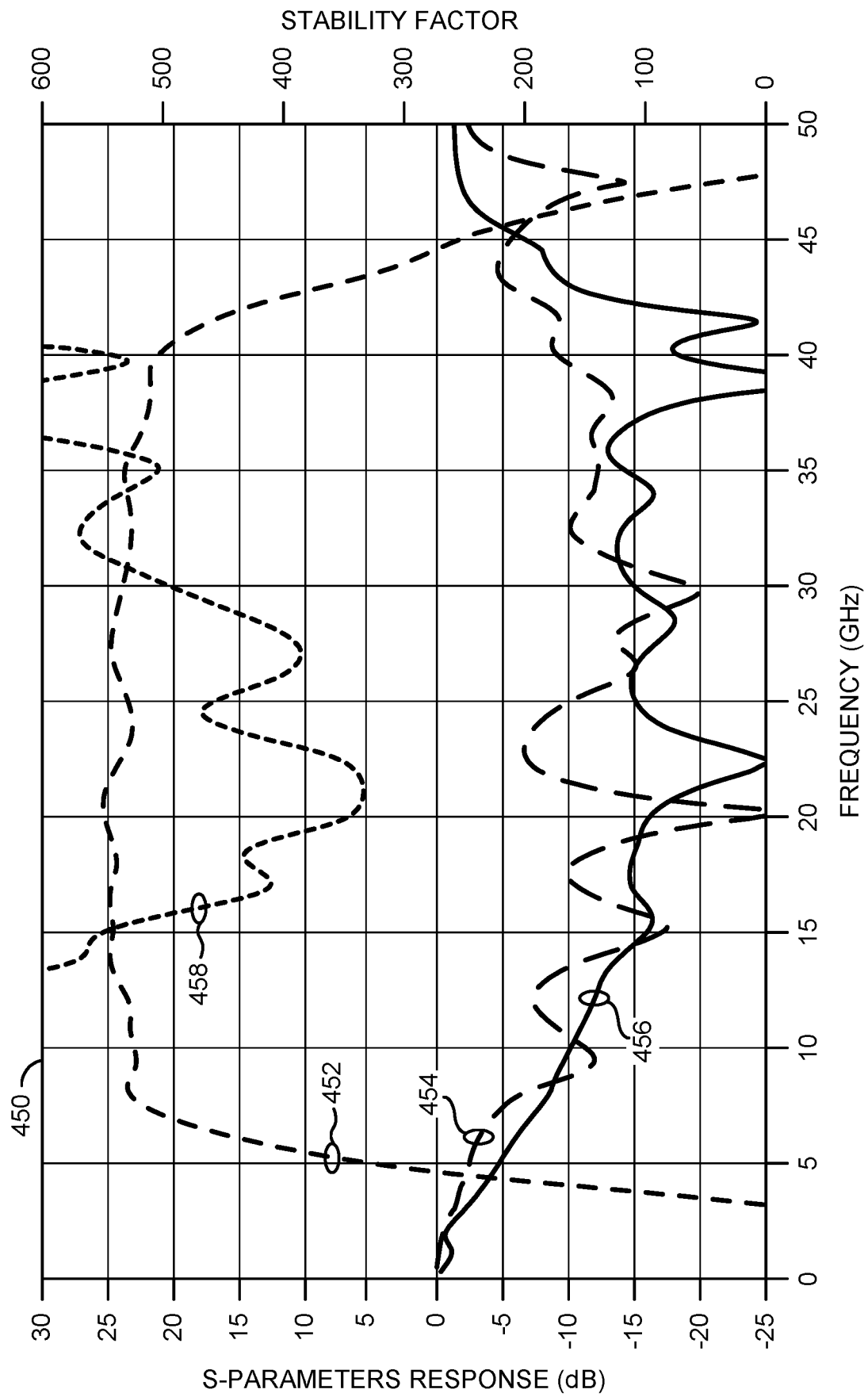
FIG. 17 is a diagram illustrating simulated S-parameter response and stability factor curves for the circuit of FIG. 16.

Referring to FIG. 17, a diagram is shown illustrating simulated S-parameter and stability factor curves for the circuit of FIG. 16. In an example, a graph 450 shows a curve 452, a curve 454, a curve 456, and a curve 458. The curve 452 generally illustrates gain of the integrated circuit amplifier 400. The curve 454 generally illustrates output return loss. The curve 456 generally illustrates input return loss. The curve 458 generally illustrates stability factor.

Figure 18:
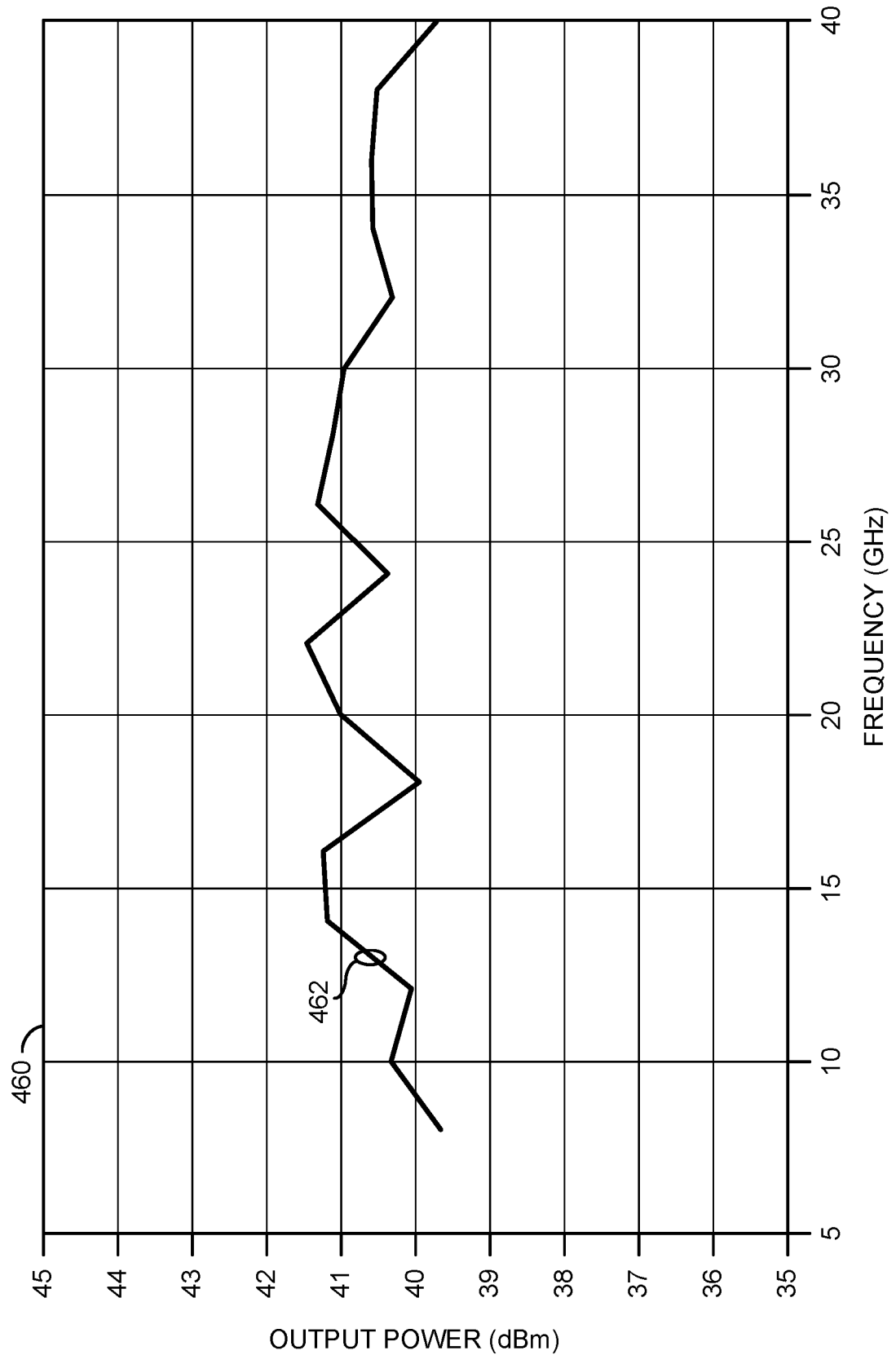
FIG. 18 is a diagram illustrating output power versus frequency for the circuit of FIG. 16.

Referring to FIG. 18, a diagram is shown illustrating output power versus frequency for the integrated circuit amplifier 400 of FIG. 16. In an example, a graph 460 shows a curve 462. The curve 462 generally illustrates output power versus frequency.

In various embodiments, the invention may include the preparation of monolithic microwave integrated circuits (MMICs), ASICs (application specific integrated circuits), Platform ASICs, FPGAS (field programmable gate arrays), PLDs (programmable logic devices), CPLDs (complex programmable logic devices), sea-of-gates, RFICS (radio frequency integrated circuits), ASSPs (application specific standard products), one or more monolithic integrated circuits, one or more chips or die arranged as flip-chip modules and/or multi-chip modules, printed circuit board technology, or by interconnecting an appropriate network of conventional component circuits, as is described herein, modifications of which will be readily apparent to those skilled in the art(s).

In various embodiments, the invention may be applied using an insulating or semiconducting substrate material including, but not limited to, an integrated circuit, a printed circuit board, thin film or thick film hybrid technology, other insulating or semiconducting substrate technology with planar conductors deposited, sputtered, etched or plated to respective surfaces, etc. In various embodiments, application of the folded-patch transformer as described herein may be implemented on all types of semiconductor substrates (especially silicon, silicon carbide, gallium arsenide, gallium nitride, and indium phosphide) as well as other substrate materials such as glass, sapphire, alumina or other ceramics, polymers and other composite or laminated materials.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a substrate;
a first patch transformer segment comprising a first rectangular metal feature disposed on said substrate, wherein the first rectangular metal feature comprises a first portion and a second portion, and a width of the second portion is greater than a width of the first portion and a length of the second portion;
a second patch transformer segment comprising a second rectangular metal feature disposed on said substrate, wherein (i) the second rectangular metal feature is aligned with the second portion of the first rectangular metal feature, (ii) a length of the second rectangular metal feature matches the length of the second portion of the first rectangular metal feature, and (iii) a width of the second rectangular metal is greater than the length of the second rectangular metal feature;
a third patch transformer segment comprising a third rectangular metal feature disposed on said substrate between a first adjacent edge of the second portion of the first rectangular metal feature and a second adjacent edge of the second rectangular metal feature, wherein (i) the third rectangular metal feature comprises a first portion and a second portion, (ii) a first edge of the third rectangular metal feature is edge-coupled with the first adjacent edge of the second portion of the first patch transformer segment, and (iii) a second edge of the third rectangular metal feature is edge-coupled with the second adjacent edge of the second patch transformer segment;
a fourth patch transformer segment comprising a fourth rectangular metal feature disposed on said substrate and connecting a first corner of the first adjacent edge of the second portion of the first rectangular metal feature to a first corner of the second adjacent edge of the second rectangular metal feature; and
a fifth patch transformer segment comprising a fifth rectangular metal feature disposed on said substrate and connecting a second corner of the second adjacent edge of the second rectangular metal feature to a first corner of the second edge of the first portion of the third rectangular metal feature, wherein the second portion of the third rectangular metal feature passes over and is separated from the fourth rectangular metal feature such that the first patch transformer segment, the second patch transformer segment, the third patch transformer segment, the fourth patch transformer segment, and the fifth patch transformer segment are coupled in series to form a folded path between a first port and a second port.

2. The apparatus according to claim 1, wherein the first patch transformer segment, the second patch transformer segment, the third patch transformer segment, the fourth patch transformer segment, and the fifth patch transformer segment are configured as a folded-patch impedance transformer.

3. The apparatus according to claim 2, wherein the first patch transformer segment, the second patch transformer segment, the third patch transformer segment, the fourth patch transformer segment, and the fifth patch transformer segment are configured to match an output impedance of an amplifier circuit with a load impedance of a transmission medium.

4. The apparatus according to claim 3, wherein the first patch transformer segment is coupled to the amplifier circuit by at least one of a transmission line, a stripline transmission line, a microstrip transmission line, an interconnect, and an electro-magnetic coupling structure.

5. The apparatus according to claim 3, wherein the first patch transformer segment is coupled to the transmission medium by at least one of a transmission line, a stripline transmission line, a microstrip transmission line, an interconnect, and an electro-magnetic coupling structure.

6. The apparatus according to claim 1, wherein the third patch transformer segment is more strongly edge-coupled to the first patch transformer segment than to the second patch transformer segment.

7. The apparatus according to claim 1, wherein the third patch transformer segment is coupled to the second transformer segment by at least one of a transmission line, a stripline transmission line, a microstrip transmission line, an interconnect, and an electro-magnetic coupling structure.

8. The apparatus according to claim 1, wherein said substrate comprises at least one of silicon, silicon carbide, gallium arsenide, gallium nitride, indium phosphide, glass, sapphire, alumina, ceramic material, polymer material, alloy, composite material, and laminated material.

9. The apparatus according to claim 1, wherein the apparatus is implemented on a monolithic microwave integrated circuit.

10. The apparatus according to claim 1, wherein the first patch transformer segment is corner loaded by a first shunt capacitor connected to a second corner of the second portion of the first rectangular metal feature and the second patch transformer segment is corner loaded by a second shunt capacitor connected to a third corner of the second rectangular metal feature to optimize performance, size, or performance and size.

11. A method of output impedance matching for an amplifier circuit comprising:
   forming a first metal layer of a folded-patch transformer on a substrate;
   forming a second metal layer of the folded-patch transformer on the first metal layer of the folded-patch transformer; and
   forming a third metal layer of the folded-patch transformer on the second metal layer of the folded-patch transformer, wherein the folded-patch transformer comprises
      (a) a first patch transformer segment comprising a first rectangular metal feature disposed on said substrate, wherein the first rectangular metal feature comprises a first portion and a second portion, and a width of the second portion is greater than a width of the first portion and a length of the second portion,
      (b) a second patch transformer segment comprising a second rectangular metal feature disposed on said substrate, wherein (i) the second rectangular metal feature is aligned with the second portion of the first rectangular metal feature, (ii) a length of the second rectangular metal feature matches the length of the second portion of the first rectangular metal feature, and (iii) a width of the second rectangular metal is greater than the length of the second rectangular metal feature,
      (c) a third patch transformer segment comprising a third rectangular metal feature disposed on said substrate between a first adjacent edge of the second portion of the first rectangular metal feature and a second adjacent edge of the second rectangular metal feature, wherein (i) the third rectangular metal feature comprises a first portion and a second portion, (ii) a first edge of the third rectangular metal feature is edge-coupled with the first adjacent edge of the second portion of the first patch transformer segment, and (iii) a second edge of the third rectangular metal feature is edge-coupled with the second adjacent edge of the second patch transformer segment,
      (d) a fourth patch transformer segment comprising a fourth rectangular metal feature disposed on said substrate and connecting a first corner of the first adjacent edge of the second portion of the first rectangular metal feature to a first corner of the second adjacent edge of the second rectangular metal feature; and
      (e) a fifth patch transformer segment comprising a fifth rectangular metal feature disposed on said substrate and connecting a second corner of the second adjacent edge of the second rectangular metal feature to a first corner of the second edge of the first portion of the third rectangular metal feature, wherein the second portion of the third rectangular metal feature passes over and is separated from the fourth rectangular metal feature such that the first patch transformer segment, the second patch transformer segment, the third patch transformer segment, the fourth patch transformer segment, and the fifth patch transformer segment are coupled in series to form a folded path between a first port and a second port.

12. The method according to claim 11, wherein the second portion of the third rectangular metal feature is separated from the fourth rectangular metal feature by an insulating material.

13. The method according to claim 11, wherein the second portion of the third rectangular metal feature is separated from the fourth rectangular metal feature by an air-gap.

14. The method according to claim 11, further comprising removing material from between the second portion of the third rectangular metal feature and the fourth rectangular metal feature to form an air-gap.

15. The method according to claim 11, wherein the first metal layer, the second metal layer, and the third metal layer are formed by at least one of depositing, sputtering, etching, or plating planar conductors to respective surfaces.

16. The method according to claim 11, further comprising:
   coupling an output of the amplifier to the first portion of the first patch transformer segment of the folded-patch transformer.

17. The method according to claim 11, further comprising:
   coupling the second portion of the third patch transformer segment of the folded-patch transformer to a radio frequency output port, wherein the first patch transformer segment, the second patch transformer segment, the third patch transformer segment, the fourth patch transformer segment, and the fifth patch transformer segment of the folded-patch transformer are coupled in series in the folded path between the output of the amplifier circuit and the radio frequency output port.

18. An apparatus comprising:
   a substrate;
   a first folded-patch transformer comprising
      (a) a first patch transformer segment comprising a first rectangular metal feature disposed on said substrate, wherein the first rectangular metal feature comprises a first portion and a second portion, and a width of the second portion is greater than a width of the first portion and a length of the second portion,
      (b) a second patch transformer segment comprising a second rectangular metal feature disposed on said substrate, wherein (i) the second rectangular metal feature is aligned with the second portion of the first rectangular metal feature, (ii) a length of the second rectangular metal feature matches the length of the second portion of the first rectangular metal feature, and (iii) a width of the second rectangular metal is greater than the length of the second rectangular metal feature,
      (c) a third patch transformer segment comprising a third rectangular metal feature disposed on said substrate between a first adjacent edge of the second portion of the first rectangular metal feature and a second adjacent edge of the second rectangular metal feature, wherein (i) the third rectangular metal feature comprises a first portion and a second portion, (ii) a first edge of the third rectangular metal feature is edge-coupled with the first adjacent edge of the second portion of the first patch transformer segment, and (iii) a second edge of the third rectangular metal feature is edge-coupled with the second adjacent edge of the second patch transformer segment, (d) a fourth patch transformer segment comprising a fourth rectangular metal feature disposed on said substrate and connecting a first corner of the first adjacent edge of the second portion of the first rectangular metal feature to a first corner of the second adjacent edge of the second rectangular metal feature, and (e) a fifth patch transformer segment comprising a fifth rectangular metal feature disposed on said substrate and connecting a second corner of the second adjacent edge of the second rectangular metal feature to a first corner of the second edge of the first portion of the third rectangular metal feature, wherein the second portion of the third rectangular metal feature passes over and is separated from the fourth rectangular metal feature such that the first patch transformer segment, the second patch transformer segment, the third patch transformer segment, the fourth patch transformer segment, and the fifth patch transformer segment are coupled in series to form a folded path between a first port and a second port; and a second folded-patch transformer comprising (a) a sixth patch transformer segment comprising a sixth rectangular metal feature disposed on said substrate, wherein the sixth rectangular metal feature comprises a first portion and a second portion, and a width of the second portion is greater than a width of the first portion and a length of the second portion, (b) a seventh patch transformer segment comprising a seventh rectangular metal feature disposed on said substrate, wherein (i) the seventh rectangular metal feature is aligned with the second portion of the sixth rectangular metal feature, (ii) a length of the seventh rectangular metal feature matches the length of the second portion of the sixth rectangular metal feature, and (iii) a width of the seventh rectangular metal is greater than the length of the seventh rectangular metal feature, (c) an eighth patch transformer segment comprising an eighth rectangular metal feature disposed on said substrate between a first adjacent edge of the second portion of the sixth rectangular metal feature and a second adjacent edge of the seventh rectangular metal feature, wherein (i) the eighth rectangular metal feature comprises a first portion and a second portion, (ii) a first edge of the eighth rectangular metal feature is edge-coupled with the first adjacent edge of the second portion of the sixth patch transformer segment, and (iii) a second edge of the eighth rectangular metal feature is edge-coupled with the second adjacent edge of the seventh patch transformer segment, (d) a ninth patch transformer segment comprising a ninth rectangular metal feature disposed on said substrate and connecting a first corner of the first adjacent edge of the second portion of the sixth rectangular metal feature to a first corner of the second adjacent edge of the seventh rectangular metal feature, and (e) a tenth patch transformer segment comprising a tenth rectangular metal feature disposed on said substrate and connecting a second corner of the second adjacent edge of the seventh rectangular metal feature to a first corner of the second edge of the first portion of the eighth rectangular metal feature, wherein the second portion of the eighth rectangular metal feature passes over and is separated from the ninth rectangular metal feature such that the sixth patch transformer segment, the seventh patch transformer segment, the eighth patch transformer segment, the ninth patch transformer segment, and the tenth patch transformer segment are coupled in series to form a folded path between a third port and the second port, wherein the first folded-patch transformer and the second folded-patch transformer are configured as a power combiner.

19. The apparatus according to claim 18, wherein the second rectangular metal feature of the first folded-patch transformer and the seventh rectangular metal feature of the second folded-patch transformer are connected together by a thin film resistor.

20. The apparatus according to claim 18, wherein the first folded-patch transformer and the second folded-patch transformer provide wideband power combining with impedance transformation and isolation between ports.

* * * * *